(12) United States Patent
    Lee

(10) Patent No.: US 11,937,492 B2
(45) Date of Patent: Mar. 19, 2024

(54) MASK ASSEMBLY AND MANUFACTURING METHOD THEREOF

(71) Applicant: Samsung Display Co., Ltd., Yongin-si (KR)

(72) Inventor: Duckjung Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/371,359

(22) Filed: Jul. 9, 2021

(65) Prior Publication Data

US 2022/0131075 A1   Apr. 28, 2022

(30) Foreign Application Priority Data

Oct. 26, 2020   (KR) .......................... 10-2020-0139410

(51) Int. Cl.
| | |
|---|---|
| *B05C 21/00* | (2006.01) |
| *C23C 14/04* | (2006.01) |
| *G03F 7/00* | (2006.01) |
| *H10K 71/00* | (2023.01) |
| *H10K 71/16* | (2023.01) |

(52) U.S. Cl.
CPC ......... *H10K 71/166* (2023.02); *B05C 21/005* (2013.01); *C23C 14/042* (2013.01); *G03F 7/0015* (2013.01); *H10K 71/00* (2023.02); *H10K 71/164* (2023.02)

(58) Field of Classification Search
None
See application file for complete search history.

(56) References Cited

U.S. PATENT DOCUMENTS

| | | | | |
|---|---|---|---|---|
| 7,821,199 B2 * | 10/2010 | Arai | ..................... | H01L 27/3223 |
| | | | | 313/506 |
| 8,628,620 B2 * | 1/2014 | Kawato | ................. | C23C 14/562 |
| | | | | 118/504 |
| 8,646,405 B2 * | 2/2014 | An | .......................... | B05B 12/20 |
| | | | | 118/504 |
| 8,656,859 B2 * | 2/2014 | Hong | .................. | H01L 51/0011 |
| | | | | 118/504 |
| 8,746,169 B2 * | 6/2014 | Lee | .......................... | C23F 1/02 |
| | | | | 118/504 |

(Continued)

FOREIGN PATENT DOCUMENTS

| | | | | |
|---|---|---|---|---|
| JP | 2015-148002 | | 8/2015 | |
| JP | 2015-148002 | A * | 8/2015 | ............. C23C 14/04 |

(Continued)

*Primary Examiner* — Jethro M. Pence
(74) *Attorney, Agent, or Firm* — KILE PARK REED & HOUTTEMAN PLLC

(57) ABSTRACT

A mask assembly includes a mask frame including a cell opening, and an outer frame defined along a periphery of the cell opening, and a cell mask disposed on the mask frame and including a polymer material. The cell mask includes a masking part which includes a deposition part disposed corresponding to the cell opening of the mask frame and including a masking pattern, and a non-deposition part extending from the deposition part, and a bonding part overlapping the outer frame of the mask frame and extending from the masking part. The non-deposition part includes a non-pattern portion, and a pattern portion having a thickness smaller than a thickness of the non-pattern portion.

10 Claims, 16 Drawing Sheets

(56) References Cited

U.S. PATENT DOCUMENTS

| | | | | |
|---|---|---|---|---|
| 8,881,676 B2* | 11/2014 | Hong | ................... | B05C 21/005 118/504 |
| 8,881,677 B2* | 11/2014 | De | ........................ | H01L 22/10 118/504 |
| 9,076,989 B2* | 7/2015 | Sonoda | ................. | H05B 33/10 |
| 9,192,959 B2* | 11/2015 | Hong | ...................... | C23F 1/02 |
| 9,346,078 B2* | 5/2016 | Oh | ..................... | H01L 51/0011 |
| 9,362,501 B2* | 6/2016 | Hsu | ....................... | C23C 14/12 |
| 9,570,715 B2* | 2/2017 | Kang | .................... | C23C 14/042 |
| 9,580,791 B2* | 2/2017 | Inoue | .................. | C23C 14/042 |
| 9,583,708 B2* | 2/2017 | Ko | ....................... | C23C 14/042 |
| 9,666,837 B2* | 5/2017 | Lee | ........................ | H01L 51/56 |
| 9,682,400 B2* | 6/2017 | Kim | ..................... | C23C 14/042 |
| 9,695,500 B2* | 7/2017 | Ko | ......................... | H01L 51/56 |
| 9,932,662 B2* | 4/2018 | Lee | .......................... | C23C 14/042 |
| 10,083,997 B2* | 9/2018 | Kim | ................... | H01L 51/0011 |
| 10,173,240 B2* | 1/2019 | Mizumura | ............. | C23C 14/04 |
| 10,196,732 B2* | 2/2019 | Kwon | ................. | C23C 14/042 |
| 10,224,350 B2* | 3/2019 | Kim | ................... | H01L 27/1288 |
| 10,301,715 B2* | 5/2019 | Yoo | ....................... | B05C 21/005 |
| 10,439,170 B2* | 10/2019 | Lin | ........................ | H01L 51/56 |
| 10,648,070 B2* | 5/2020 | Li | ......................... | C23C 14/04 |
| 10,663,857 B2* | 5/2020 | Lv | ....................... | H01L 51/5012 |
| 10,711,338 B2* | 7/2020 | Kawato | ................. | H01L 51/001 |
| 10,787,729 B2* | 9/2020 | Bai | ....................... | C23C 14/042 |
| 10,868,268 B2* | 12/2020 | Kim | ................... | H01L 51/5203 |
| 10,903,426 B2* | 1/2021 | Fujito | ..................... | C23F 1/16 |
| 10,982,314 B2* | 4/2021 | Lin | ........................ | C23C 14/042 |
| 11,041,237 B2* | 6/2021 | Takeda | .................. | C23C 16/042 |
| 11,396,693 B2* | 7/2022 | Bai | ...................... | B05C 21/005 |
| 2008/0018236 A1* | 1/2008 | Arai | ...................... | C23C 14/042 445/24 |
| 2014/0150721 A1* | 6/2014 | Oh | ....................... | C23C 14/042 118/504 |
| 2015/0007768 A1* | 1/2015 | Lee | ....................... | C23C 14/042 118/504 |
| 2015/0034005 A1* | 2/2015 | Ko | ....................... | H01L 51/0011 118/504 |
| 2015/0047560 A1* | 2/2015 | Kang | ................... | H01L 27/3223 118/504 |
| 2016/0144393 A1* | 5/2016 | Kwon | .................. | C23C 14/042 118/504 |
| 2016/0168691 A1* | 6/2016 | Takeda | ................. | C23C 14/042 118/504 |
| 2018/0163290 A1* | 6/2018 | Xu | ....................... | C23C 14/042 |
| 2018/0171470 A1* | 6/2018 | Takeda | ............... | B23K 26/0661 |
| 2019/0233931 A1* | 8/2019 | Zhang | ..................... | B05D 1/32 |
| 2020/0208284 A1* | 7/2020 | Kim | ........................ | C25D 1/10 |
| 2021/0108303 A1* | 4/2021 | Ahn | ........................ | H01L 51/56 |
| 2021/0147976 A1* | 5/2021 | Huang | ................... | G06F 1/189 |
| 2021/0210735 A1* | 7/2021 | Kang | .................... | H01L 51/56 |
| 2021/0249603 A1* | 8/2021 | Kim | ................... | H01L 51/0011 |
| 2021/0269913 A1* | 9/2021 | Takeda | ............... | B23K 26/0604 |
| 2021/0343760 A1* | 11/2021 | Jo | .......................... | C23C 14/54 |
| 2021/0355572 A1* | 11/2021 | Li | ............................ | C23C 14/12 |
| 2021/0404079 A1* | 12/2021 | Xiao | ...................... | B05C 17/06 |
| 2021/0408134 A1* | 12/2021 | Li | ........................... | H01L 51/56 |
| 2022/0018011 A1* | 1/2022 | Ko | ........................ | C23C 14/042 |

FOREIGN PATENT DOCUMENTS

| | | |
|---|---|---|
| JP | 6142388 | 6/2017 |
| JP | 2018-59139 | 4/2018 |

* cited by examiner

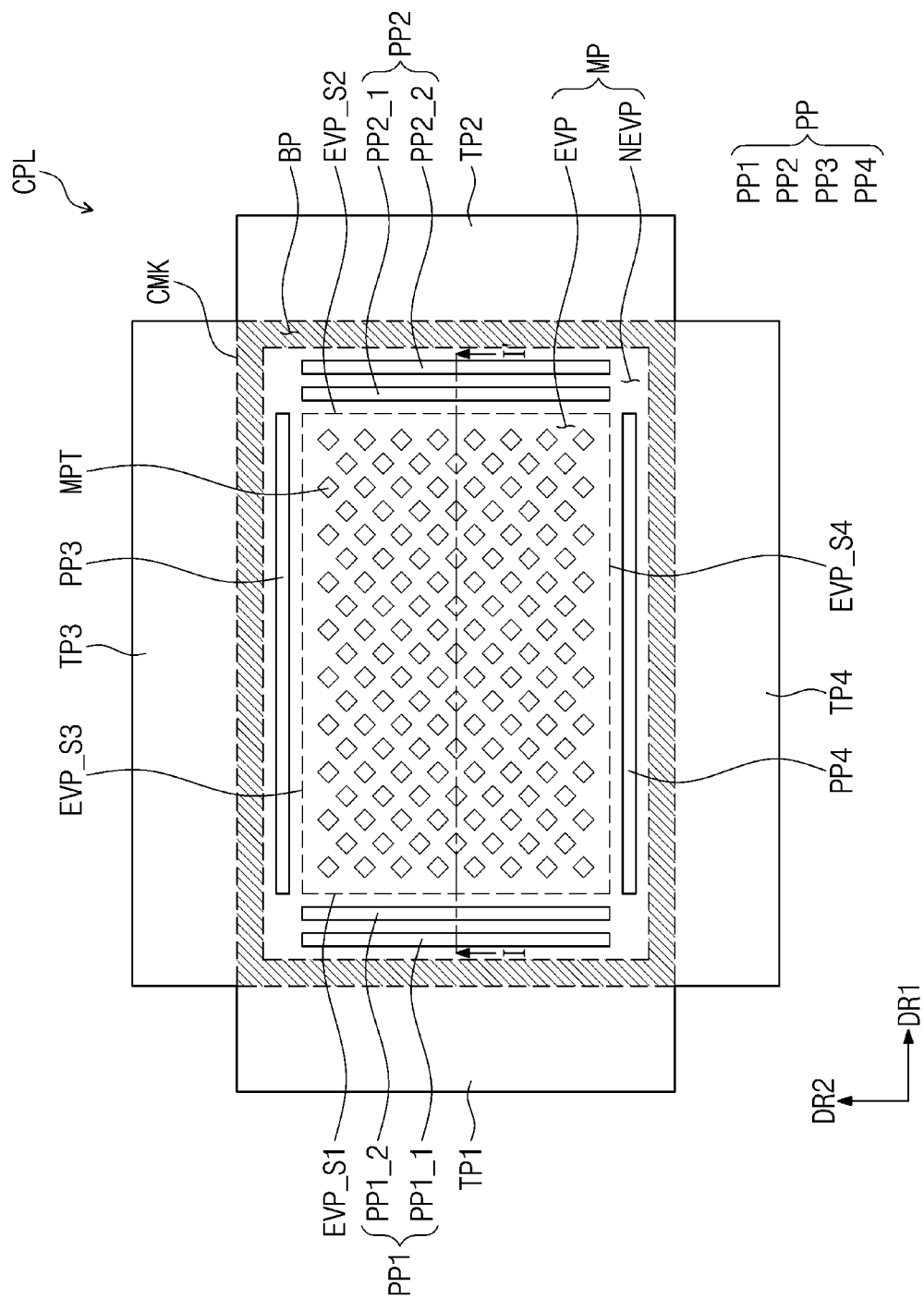

MASK ASSEMBLY AND MANUFACTURING METHOD THEREOF

CROSS-REFERENCE TO RELATED APPLICATION(S)

This application claims priority to and benefits of Korean Patent Application No. 10-2020-0139410 under 35 U.S.C. § 119, filed on Oct. 26, 2020 in the Korean Intellectual Property Office, the entire contents of which are herein incorporated by reference.

BACKGROUND

1. Technical Field

The disclosure herein relates to a mask assembly including a cell mask including a polymer material, and a manufacturing method thereof.

2. Description of the Related Art

Display panels each include many pixels. The pixels each include a drive element such as a transistor and a display element such as an organic light-emitting diode. The display element may be formed on a substrate by laminating electrodes and a light-emitting pattern on the substrate.

The light-emitting pattern may be patterned using a mask having a masking pattern defined therein so as to be formed in a predetermined region. The light-emitting pattern may be formed in a region exposed by the masking pattern. The shape of the light-emitting pattern may be controlled according to the shape of the masking pattern. Recently, in order to enhance the production yield of display panels including the light-emitting pattern, materials and methods for manufacturing large-area masks are being developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a mask assembly in which a masking pattern included in a cell mask including a polymer material may be prevented from being deformed.

An embodiment of the disclosure provides a mask assembly that may include a mask frame including a cell opening, and an outer frame defined along a periphery of the cell opening, and a cell mask disposed on the mask frame and including a polymer material. The cell mask may include a masking part including a deposition part disposed corresponding to the cell opening of the mask frame and including a masking pattern, and a non-deposition part extending from the deposition part, and a bonding part overlapping the outer frame of the mask frame and extending from the masking part. The non-deposition part may include a non-pattern portion, and a pattern portion having a thickness smaller than a thickness of the non-pattern portion.

In an embodiment, the masking part may be parallel to a plane defined by a first direction and a second direction intersecting the first direction. The pattern portion may include a first pattern portion disposed along a side among sides facing each other in the first direction of the deposition part, and a second pattern portion disposed along another side among the sides facing each other in the first direction of the deposition part.

In an embodiment, a thickness of the first pattern portion and a thickness of the second pattern portion may be different from each other.

In an embodiment, at least one of the first pattern portion and the second pattern portion may include sub pattern portions spaced apart from each other in the first direction.

In an embodiment, the pattern portion may further include a third pattern portion disposed along a side among sides facing each other in the second direction of the deposition part, and a fourth pattern portion disposed along another side among the sides facing each other in the second direction of the deposition part.

In an embodiment, a thickness of at least one pattern portion among the first to fourth pattern portions may be different from thicknesses of other pattern portions among the first to fourth pattern portions.

In an embodiment, at least one of the third pattern portion and the fourth pattern portion may include sub pattern portions spaced apart from each other in the second direction.

In an embodiment, the pattern portion may include curved surface portions.

In an embodiment, the cell mask may include polyimide.

In an embodiment, the mask assembly may further include a mesh frame disposed between the mask frame and the cell mask and comprising a metallic material.

In an embodiment, a method for manufacturing a mask assembly may include manufacturing a cell mask including a masking part, and disposing the cell mask on a mask frame. The manufacturing of the cell mask may include etching a base substrate to form a pattern layer having a protruding pattern, and applying a polymer material on the pattern layer to form a polymer layer. The manufacturing of the cell mask may further include forming, on the polymer layer, a deposition part including a masking pattern and a non-deposition part extending from the deposition part, and separating the polymer layer and the pattern layer to obtain the cell mask. The non-deposition part may include a non-pattern portion, and a pattern portion corresponding to the protruding pattern and having a thickness smaller than a thickness of the non-pattern portion.

In an embodiment, the cell mask may include polyimide.

In an embodiment, the protruding pattern may include a curved surface portion.

In an embodiment, the forming of the polymer layer may include flattening the polymer material applied on the pattern layer, and heat treating the flattened polymer material to form the polymer layer.

In an embodiment, the forming of the masking part may include applying a photoresist on the polymer layer, and patterning the photoresist to form an etching mask. The forming of the masking part may further include etching the polymer layer using the etching mask to form the deposition part comprising the masking pattern.

In an embodiment, the method may further include disposing a mesh frame including a metallic material on the mask frame, and disposing the cell mask on the mesh frame.

In an embodiment, a method for manufacturing a mask assembly may include manufacturing a polymer layer including a polymer material, disposing the polymer layer on a mask frame and forming a masking pattern on the polymer layer to manufacture a cell mask. The manufacturing of the polymer layer may include etching a base substrate to form a pattern layer comprising a protruding pattern, applying the polymer material on the pattern layer to form the polymer layer, and separating the polymer layer and the pattern layer from each other. The manufacturing of the cell mask may include forming a masking part including a deposition part including a masking pattern on the polymer layer and a non-deposition part extending from the deposition part. The non-deposition part may include a non-pattern portion and a pattern portion corresponding to the protruding pattern and having a thickness smaller than a thickness of the non-pattern portion.

In an embodiment, the cell mask may include polyimide.

In an embodiment, the forming of the polymer layer may include flattening the applied polymer material, and heat treating the flattened polymer material to form the polymer layer.

In an embodiment, the method may further include disposing a mesh frame including a metallic material on the mask frame, and disposing the polymer layer on the mesh frame.

BRIEF DESCRIPTION OF THE FIGURES

The accompanying drawings are included to provide a further understanding of embodiments, and are incorporated in and constitute a part of this description. The drawings illustrate embodiments and, together with the description, serve to explain principles of the disclosure. In the drawings:

FIGS. 4A and 4B are schematic plan views of the a cell mask film according to an embodiment;

DETAILED DESCRIPTION OF THE EMBODIMENTS

Figure 1:
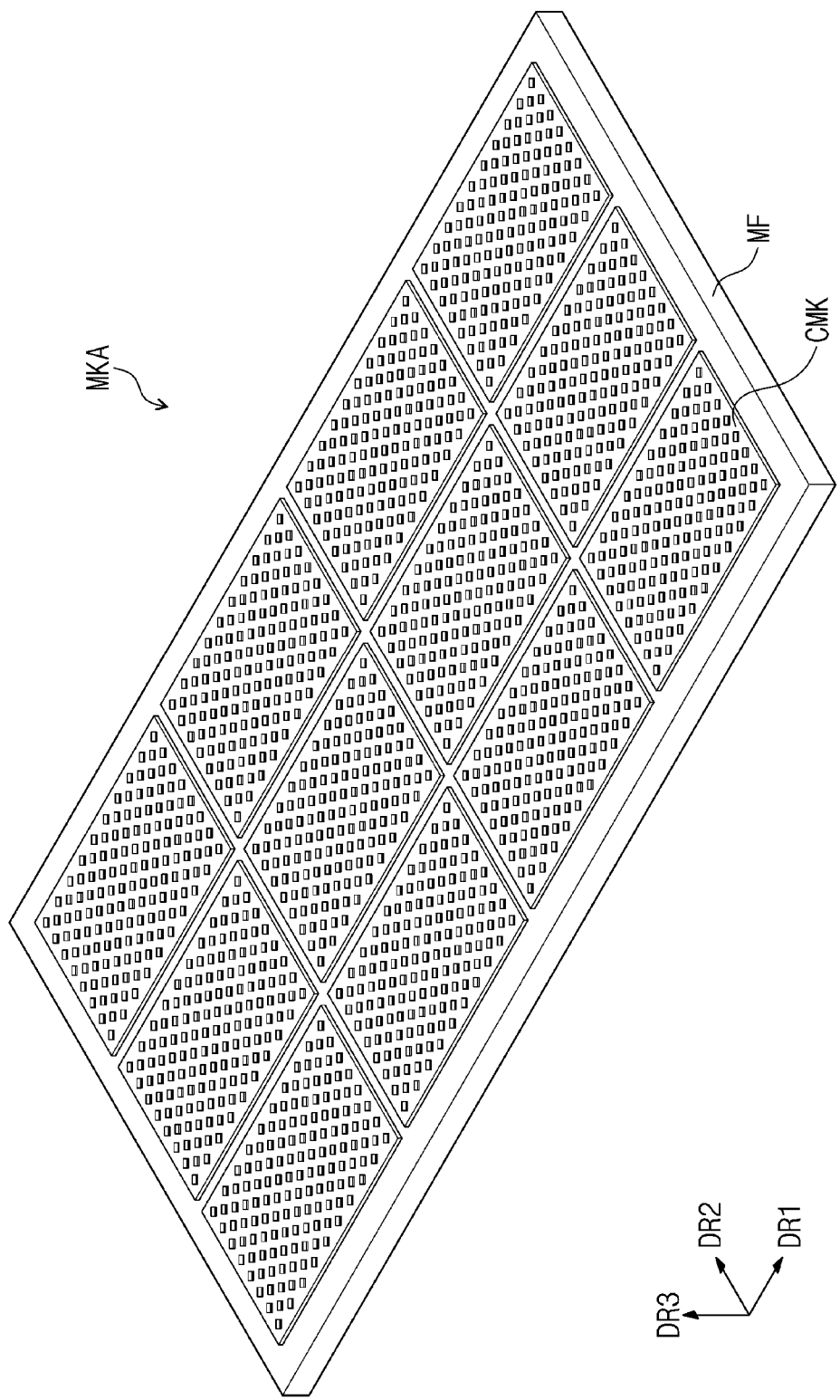
FIG. 1 is a schematic perspective view of a mask assembly according to an embodiment.

The disclosure will now be described more fully hereinafter with reference to the accompanying drawings, in which embodiments are shown and where like reference characters refer to like elements. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this description, it will be understood that when an element (or a region, a layer, portion, etc.) is referred to as being "on", "connected to" or "coupled to" another element or layer, it can be directly on, connected or coupled to the other element, or a third intervening element may be present therebetween.

Like reference symbols refer to like elements. Also, in the figures, the thicknesses, the ratios and the dimensions of elements may be exaggerated for effective illustration of technological contents.

The term "and/or" includes all of one or more combinations that can be defined by associated items. For example, "A and/or B" may be understood to mean "A, B, or A and B." The terms "and" and "or" may be used in the conjunctive or disjunctive sense and may be understood to be equivalent to "and/or."

Although the terms such as "first" and "second" may be used herein to describe various elements, these elements should not be limited by these terms. The terms are only used to distinguish one element from other elements. For example, without departing from the scope of the disclosure, a first component may be referred to as a second component, and similarly, the second component may also be referred to as the first component. Singular forms may include plural forms (and vice versa) unless clearly defined otherwise in context.

In addition, terms such as "under", "below", "on", and "above" may be used to describe the relationship between elements illustrated in the figures. The terms have relative concepts, and are described with respect to directions illustrated in the figures.

Unless defined or implied otherwise, all terms (including technical terms and scientific terms) used herein have the same meaning as that generally understood by those skilled in the art to which the disclosure belongs. It will be further understood that terms, such as those defined in commonly used dictionaries, should be interpreted as having a meaning that is consistent with their meaning in the context of the relevant art and will not be interpreted in an idealized or excessively formal sense unless so defined herein.

It should be further understood that terms such as "comprise", "include", and "have", when used herein, specify the presence of stated features, numbers, steps, operations, elements, components or combinations thereof, but do not preclude the presence or addition of one or more other features, numbers, steps, operations, elements, components, and/or combinations thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About", "approximately", "substantially" and the like, as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
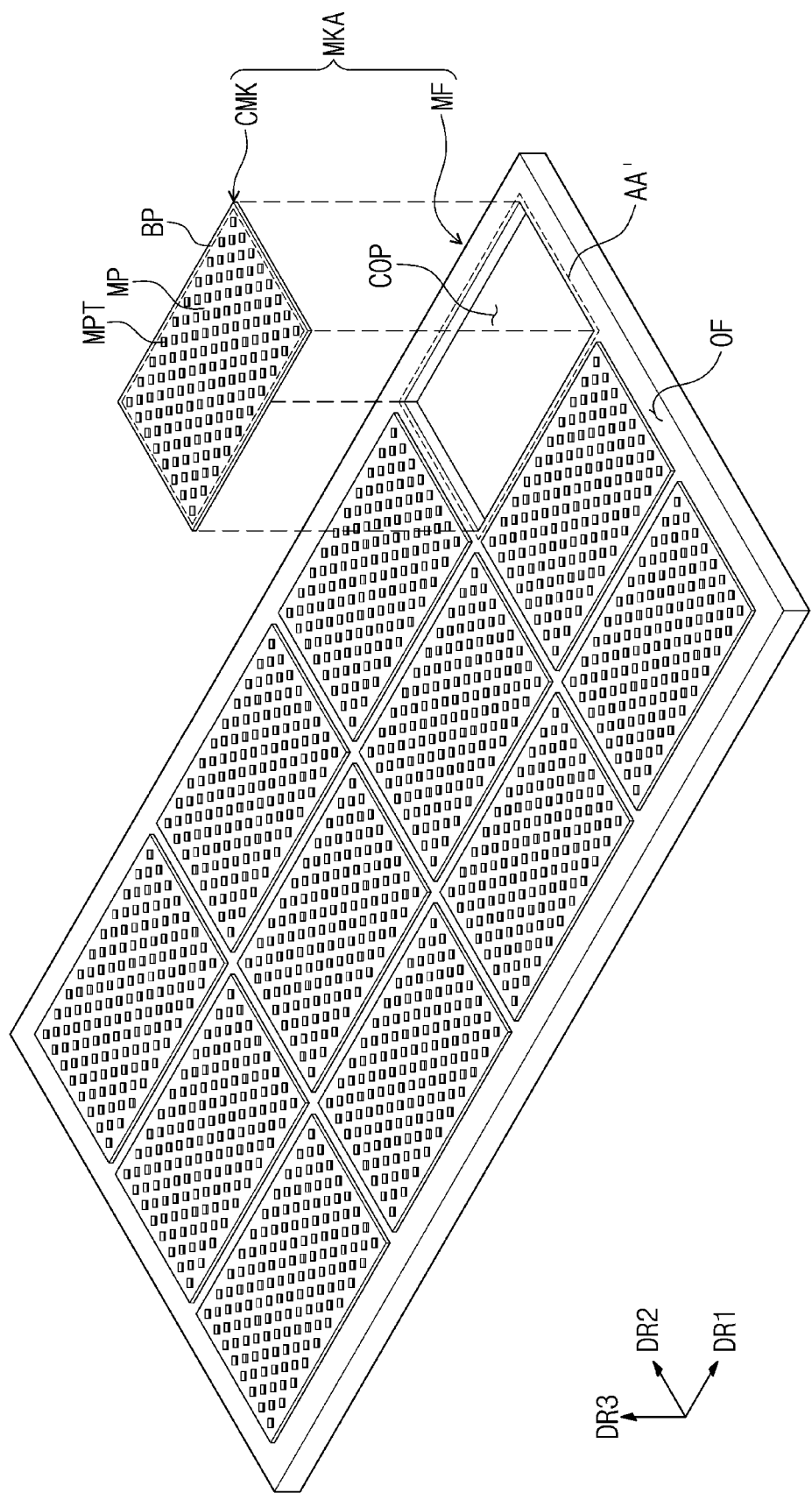
FIG. 2 is an exploded schematic perspective view of a mask assembly according to an embodiment.

FIG. 1 is a schematic perspective view of a mask assembly according to an embodiment, and FIG. 2 is an exploded schematic perspective view of a mask assembly according to an embodiment.

For convenience of description, one cell mask CMK is separated from a mask frame MF and displayed in FIG. 2.

Referring to FIGS. 1 and 2, a mask assembly MKA may be used for a process for manufacturing a display device. Specifically, the mask assembly MKA may be used for a process for depositing a pattern such as a light-emitting pattern on a deposition substrate of a display device.

The mask assembly MKA may have a rectangular parallelepiped shape. For example, the mask assembly MKA may have two long sides extending in a first direction DR1 and two short sides extending in a second direction DR2. The second direction DR2 may indicate a direction intersecting the first direction DR1.

The mask assembly MKA may be a thin plate having a small thickness in the third direction DR3. The third direction DR3 may indicate a direction substantially perpendicularly intersecting the plane defined by the first direction DR1 and the second direction DR2. In this application, the wording "when viewed in a plan view" may hereinafter mean a state of viewing in the third direction DR3.

The mask assembly MKA may include a mask frame MF and cell masks CMK. The mask frame MF may include a metallic material such as stainless steel (SUS), an invar alloy, nickel (Ni), cobalt (Co), or a combination thereof. For example, the mask frame MF may include an invar alloy. However, the material for the mask frame MF is not limited thereto. For example, in order to reduce the weight of a member, the mask frame MF may also include a polyimide-based material.

Each of the cell masks CMK may include a polymer material. For example, each of the cell masks CMK may include polyimide. However, materials for the cell masks CMK are not limited thereto, and for durability of members, each of the cell masks CMK may have a metallic material such as invar or stainless steel (SUS).

The mask frame MF may have a rectangular shape having long sides extending in the first direction DR1 and short sides extending in the second direction DR2. The mask frame MF may include cell openings COP and an outer frame OF defined along the periphery of cell openings COP. The cell openings COP may be arrayed in at least one direction among the first direction DR1 and the second direction DR2. The cell openings COP may be arrayed in a matrix shape in the first direction DR1 and the second direction DR2.

When viewed in a plan view, the cell openings COP may each have a rectangular shape. With respect to the third direction DR3, the cell openings COP may be defined passing through the mask frame MF.

FIGS. 1 and 2 illustrate 12 cell openings COP, but this is an example, and the number of the cell openings COP may actually be more than or smaller than 12. In addition, the shape of each of the cell masks CMK may be changed according to the shape of the cell openings COP.

When viewed in a plan view, the cell masks CMK may respectively overlap the cell openings COP. When viewed in a plan view, the cell masks CMK may each have a rectangular shape.

Each of the cell masks CMK may include a masking part MP and a bonding part BP. The masking part MP may be provided with a masking pattern MPT. The masking pattern MPT may be formed by passing through the cell masks CMK in the third direction DR3. The bonding part BP may extend from the masking part MP in the first direction DR1 and the second direction DR2. When viewed in a plan view, the bonding part BP may have a rectangular ring shape and be disposed along the periphery of the masking part MP.

When viewed in a plan view, the area of the masking part MP of each of the cell masks CMK may be the same as the area of each of the cell openings COP. The bonding part BP of each cell mask CMK may be disposed on an outer frame OF of the mask frame MF.

The cell masks CMK may be fixed onto the mask frame MF. For example, the bonding part BP of each cell mask CMK may be fixed to a corresponding portion of the outer frame OF. For example, a welding process may be performed between the outer frame OF and the bonding part BP.

The cell masks CMK may be composed of a polymer material. When welding the bonding part BP of each cell mask CMK composed of a polymer material directly to the outer frame OF, the cell masks CMK may be damaged. Accordingly, a protective layer may be disposed on the bonding part BP of each cell mask CMK so as to prevent damage to the cell masks CMK.

In an embodiment, a recess section (not shown) may be defined in the outer frame OF. After disposing the cell masks CMK on the mask frame MF, the protective layer may be disposed on the bonding part BP of each cell mask CMK so as to correspond to the recess section. In an embodiment, the protective layer and the outer frame OF may be bonded by welding the protective layer through a welding process. For example, as the protective layer disposed on each cell mask CMK may be bonded to the outer frame OF, the cell masks CMK may be fixed to the outer frame OF. The protective layer may include metal.

In an embodiment, a mask assembly may include a mask frame and a single cell mask. The single cell mask may include masking parts and a bonding part. The masking parts each may be provided with a masking pattern. The bonding part may extend from the making parts in the first direction DR1 and the second direction DR2. When viewed in a plan view, the bonding part may have a rectangular ring shape and may be disposed along the peripheries of the masking parts.

Figure 3:
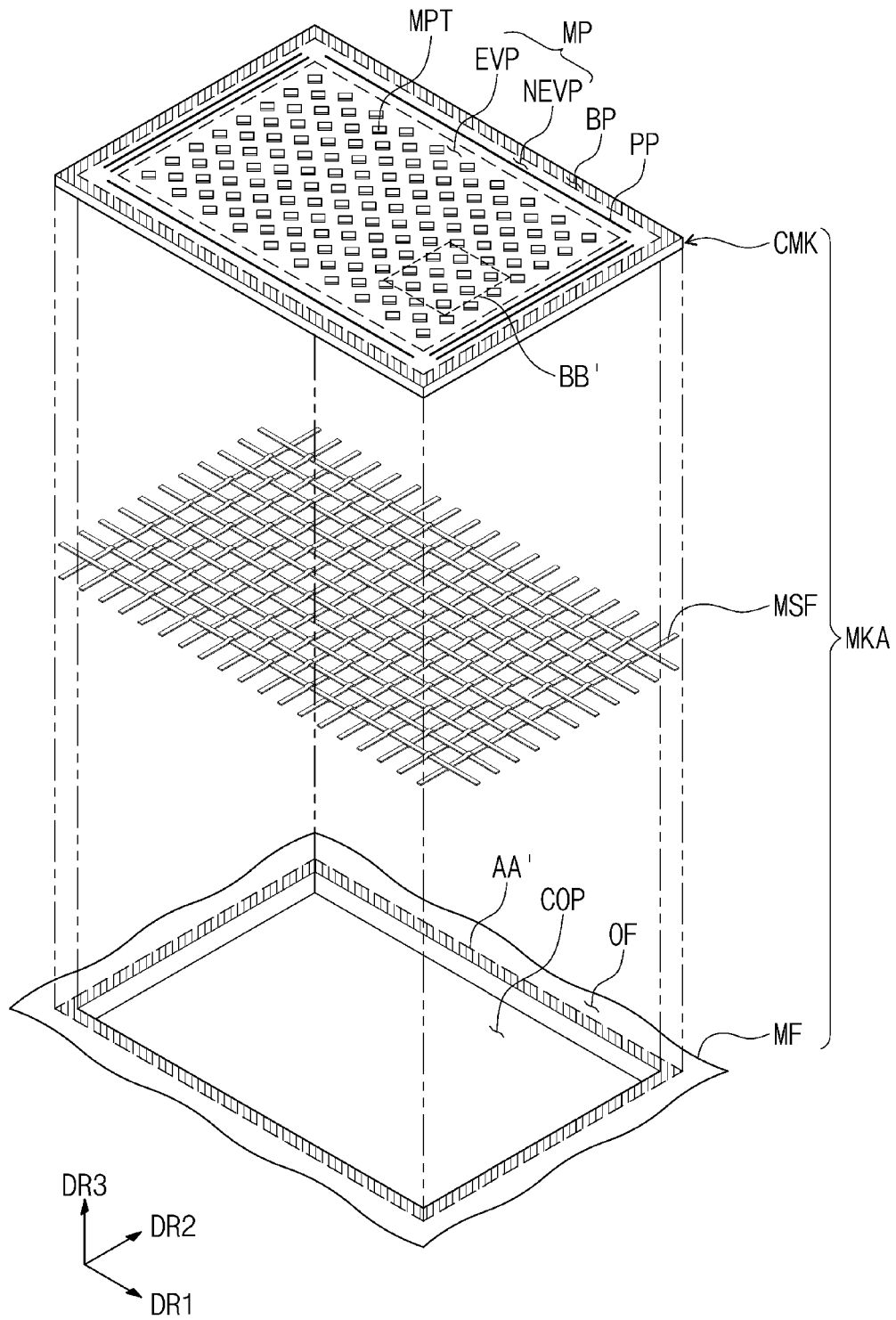
FIG. 3 is an exploded schematic perspective view of a portion of a mask assembly according to an embodiment.

FIG. 3 is an exploded schematic perspective view of a portion of a mask assembly according to an embodiment.

Referring to FIG. 3, the mask assembly MKA may include a mask frame MF, a cell mask CMK, and a mesh frame MSF. FIG. 3 illustrates the mask frame MF corresponding to AA' illustrated in FIG. 2 and a single cell mask CMK disposed on the mask frame MF. FIG. 3 illustrates a single cell opening COP corresponding to the cell mask CMK among the cell openings provided to the mask frame MF. Hereinafter, detailed descriptions of the same configuration as those described with reference to FIGS. 1 and 2 will be omitted.

The cell mask CMK may include the masking part MP disposed corresponding to the corresponding cell opening COP and a bonding part BP overlapping the outer frame OF, and extending from the masking part MP.

The masking part MP may include a deposition part EVP including a masking pattern MPT and a non-deposition part NEVP extending from the deposition part EVP. The non-deposition part NEVP may include a non-pattern portion NPT (see FIG. 5A) and a pattern portion PP having a smaller thickness than the non-pattern portion NPT. A detailed description of the pattern portion PP will be described later in FIGS. 4A to 5B.

Referring to FIGS. 2 and 3, in a region overlapping the outer frame OF, the bonding part BP and the outer frame OF may be bonded and the cell mask CMK may be fixed to the mask frame MF.

The mesh frame MSF may be disposed between the mask frame MF and the cell mask CMK. The mesh frame MSF may have a shape corresponding to the cell mask CMK. The mesh frame MSF may include openings corresponding to the masking pattern MPT formed in the deposition part EVP of the cell mask CMK. The mesh frame MSF may include a metallic material. In an embodiment, the mesh frame MSF may include stainless steel (SUS) or an invar alloy. In addition, in an embodiment, the mask assembly MKA may include mesh frames and the mesh frames may be integrally formed with each other to provide a single mesh frame corresponding to the entirety of the cell openings COP shown in FIG. 2.

In a process for depositing a light-emitting pattern or the like of a display device using a mask assembly MKA, an upward-type deposition method may be used. In order to prevent a phenomenon in which the mask assembly MKA and a substrate of the display device are deflected, a degree of close contact between the mask assembly MKA and the substrate may be enhanced by disposing a magnet on the mask assembly MKA and the substrate to form a magnetic field. However, in an embodiment, in case that the cell mask CMK includes a polymer material, the cell mask CMK does not respond to the magnetic field and it may be difficult to enhance the degree of close contact between the cell mask CMK and the substrate. Accordingly, in an embodiment, the mesh frame MSF including metal may be disposed between the mask frame MF and the cell mask CMK. In case that the mesh frame MSF responds to the magnetic field and makes close contact with the substrate, the degree of close contact between the cell mask CMK and the substrate may be enhanced, and thus, misalignment between the light-emitting pattern and the masking pattern MPT may be prevented and a shadow effect during deposition of the light-emitting pattern may be reduced.

Figure 4B:
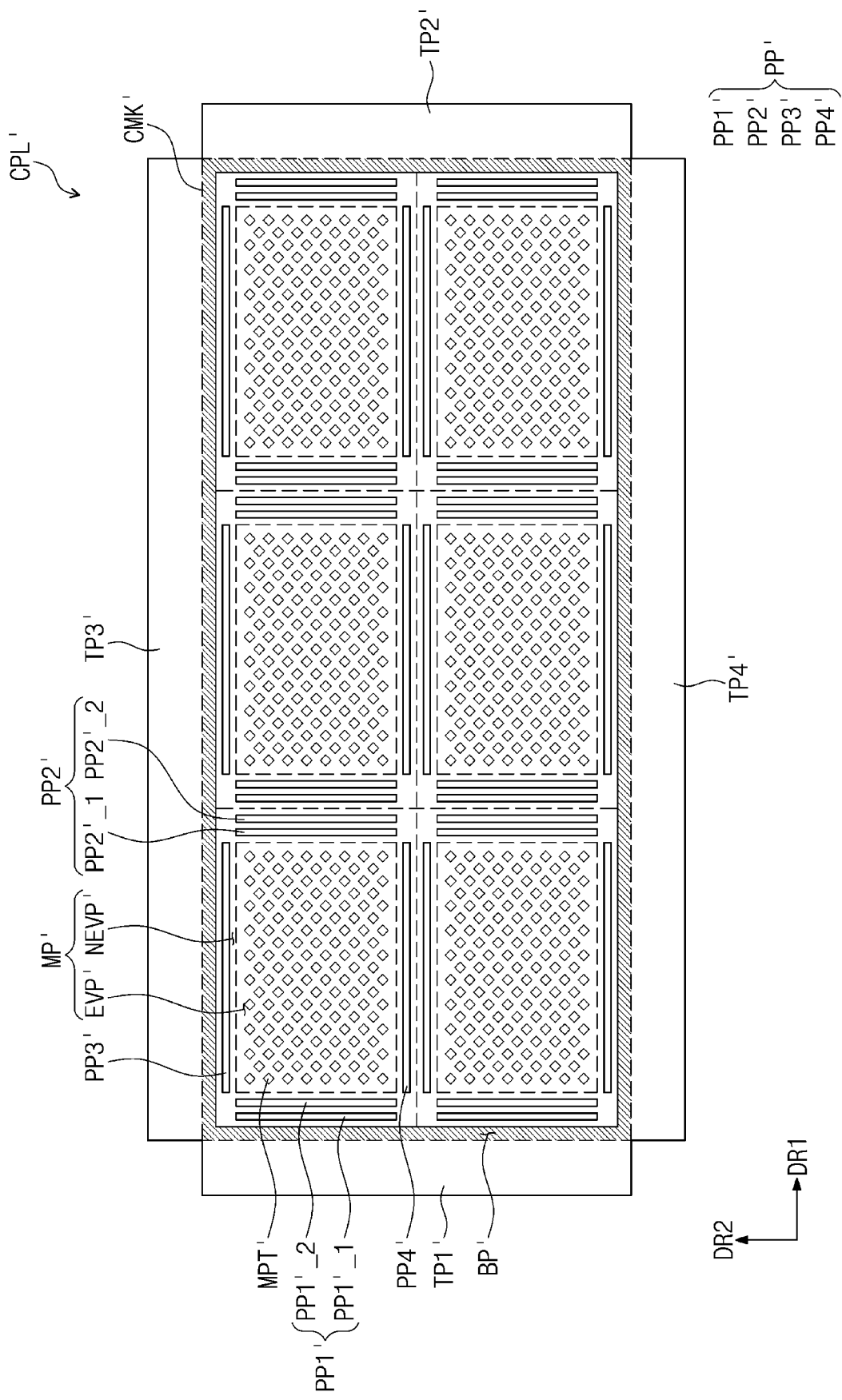

FIGS. 4A and 4B are schematic plan views of a cell mask film according to an embodiment. Hereinafter, the description on the same configuration as those described with reference to FIGS. 1 to 3 will be omitted.

Referring to FIG. 4A, a cell mask film CPL may include the cell mask CMK and tension parts TP1 to TP4. The cell mask CMK may include the masking part MP and the bonding part BP.

The tension parts TP1 to TP4 may extend from the bonding part BP and may be spaced apart from the masking part MP with the bonding part BP therebetween. The tension parts TP1 to TP4 may include first to fourth tension parts TP1 to TP4 disposed respectively corresponding to the four sides of the cell mask CMK having a rectangular shape.

The first tension part TP1 may be disposed adjacent to a first short side of the bonding part BP and extend in the second direction DR2. The first tension part TP1 may be stretched from the bonding part BP in the reverse direction of the first direction DR1 in case coupled to the mask frame MF (shown in FIG. 3).

The second tension part TP2 may be disposed adjacent to a second short side of the bonding part BP, may be spaced apart from the first tension part TP1 in the first direction DR1, and extend in the second direction DR2. The second tension part TP2 may be stretched from the bonding part BP in the first direction DR1 in case coupled to the mask frame MF.

The third tension part TP3 may be disposed adjacent to a first long side of the bonding part BP and extend in the first direction DR1. The third tension part TP3 may be stretched from the bonding part BP in the second direction DR2 in case coupled to the mask frame MF.

The fourth tension part TP4 may be disposed adjacent to a second long side of the bonding part BP, may be spaced apart from the third tension part TP3 in the second direction DR2, and extend in the first direction DR1. The fourth tension portion TP4 may be stretched from the bonding part BP in the reverse direction of the second direction DR2 in case coupled to the mask frame MF.

The cell mask film CPL may be stretched by the first to fourth tension parts TP1 to TP4 in a direction away from the masking part MP on a plane defined by the first and second directions DR1 and DR2, and be disposed on the mask frame MF and be bonded. After the bonding part BP of the cell mask CMK included in the cell mask film CPL may be bonded on to the mask frame MF, the first to fourth tension parts TP1 to TP4 may be removed from the cell mask film CPL.

The masking part MP may be parallel to the plane defined by the first direction and the second direction crossing the first direction. The masking part MP may include the deposition part EVP including the masking pattern MPT and the non-deposition part NEVP extending from the deposition part EVP. In an embodiment, the masking pattern MPT is illustrated in a diamond shape, but the embodiment is not limited thereto, and the masking pattern may be formed in a rectangular shape or in a circular shape, or the like.

Figure 5A:
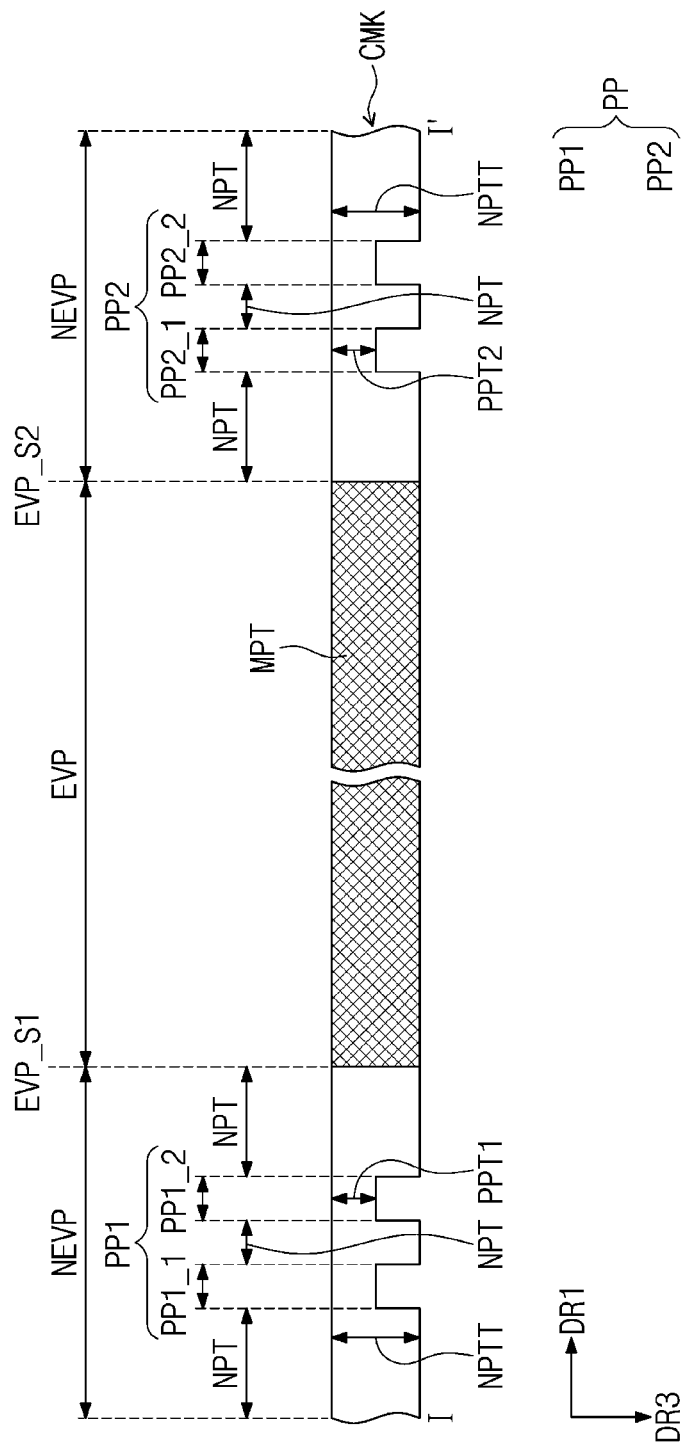
FIGS. 5A and 5B are schematic cross-sectional views of a cell mask taken along cut line I-I' shown in FIG. 4A.

The non-deposition part NEVP may include the pattern portion PP and the non-pattern portion NPT (see FIG. 5A). The deposition part EVP may include a first side EVP_S1 and a second side EVP_S2 which may be spaced apart in the first direction DR1 and extend in the second direction DR2, and include a third side EVP_S3 and a fourth side EVP_S4 which may be spaced apart in the second direction DR2 and extend in the first direction DR1.

The pattern portion PP may include a first pattern portion PP1 disposed along the first side EVP_S1 and a second pattern portion PP2 disposed along the second side EVP_S2. In an embodiment, a thickness PPT1 (see FIG. 5A) of the first pattern portion PP1 and a thickness PPT2 (see FIG. 5A) of the second pattern portion PP2 may be smaller than a thickness NPTT (see FIG. 5A) of the non-pattern portion NPT.

When viewed in a plan view, in case that a tensile force is applied to an object, and in case that there is a portion having a small thickness, a phenomenon occurs in which tensile force may be concentrated to the portion having a small thickness. In an embodiment, in a process of disposing the cell mask film CPL on the mask frame MF, in case that the cell mask CMK receives a tensile force in the first direction DR1 and in a reverse direction of the first direction DR1 by the first and second tension parts TP1 and TP2, the stress due to the tensile force may be concentrated to the first and second pattern portions PP1 and PP2 of the cell mask CMK. Accordingly, the cell mask CMK may be stretched and disposed on the mask frame MF in order to enhance the degree of close contact between the cell mask CMK and the mask frame MF, the masking pattern MPT included in the deposition part EVP may be prevented from being deformed by the stress due to a tensile force.

At least one pattern portion among the first and second pattern portions PP1 and PP2 may include sub pattern portions spaced apart from each other in the first direction DR1. In an embodiment, the first pattern portion PP1 may include a first sub pattern portion PP1_1 and a second sub pattern portion PP1_2 which may be spaced apart from each other in the first direction DR1 and extend in the second direction DR2. The second pattern portion PP2 may include a third sub pattern portion PP2_1 and a fourth sub pattern portion PP2_2 which may be spaced apart from each other in the first direction DR1 and extend in the second direction DR2.

The pattern portion PP may further include a third pattern portion PP3 disposed along the third side EVP_S3 and a fourth pattern portion PP4 disposed along the fourth side EVP_S4. In an embodiment, a thicknesses (not shown) of the third pattern portion PP3 and a thickness of the fourth pattern portion PP4 may be smaller than the thickness NPTT of the non-pattern portion NPT. In an embodiment, in a process of disposing the cell mask CMK on the mask frame MF, in case that the cell mask CMK receives a tensile force in the second direction DR2 and the reverse direction of the second direction DR2 by the third and fourth tension parts TP3 and TP4, the stress due to the tensile force may be concentrated to the third and fourth pattern portions PP3 and PP4 of the cell mask CMK.

At least one pattern portion among the third and fourth pattern portions PP3 and PP4 may include sub pattern portions spaced apart from each other in the second direction DR2. In an embodiment, although not shown, the third pattern portion PP3 may include sub pattern portions which may be spaced apart from each other in the second direction DR2 and extend in the first direction DR1. The fourth pattern portion PP4 may include sub pattern portions which may be spaced apart from each other in the second direction DR2 and extend in the first direction DR1.

Referring to FIG. 4B, a cell mask film CPL may include a cell mask CMK' and tension parts TP1' to TP4'. The cell mask CMK' may include masking parts MP' and a bonding part BP'. Hereinafter, descriptions of the same configuration as those described with reference to FIG. 4A will be omitted.

The tension parts TP1' to TP4' extend from the bonding part BP' of the cell mask CMK' and may be spaced apart from the masking part MP' with the bonding part BP' therebetween. The tension parts TP1' to TP4' may include first to fourth tension parts TP1' to TP4' disposed respectively corresponding to the four sides of the cell mask CMK' having a rectangular shape.

The first tension part TP1' may be disposed adjacent to a first short side of the cell mask CMK' and extend in the second direction DR2. The first tension part TP1' may be stretched from the cell mask CMK' in the reverse direction of the first direction DR1 in case coupled to the mask frame MF (shown in FIG. 3).

The second tension part TP2' may be disposed adjacent to a second short side of the cell mask CMK', may be spaced apart from the first tension part TP1' in the first direction DR1, and extend in the second direction DR2. The second tension part TP2' may be stretched from the cell mask CMK' in the first direction DR1 in case coupled to the mask frame MF.

The third tension part TP3' may be disposed adjacent to a first long side of the cell mask CMK' and extend in the first direction DR1. The third tension part TP3' may be stretched from the cell mask CMK' in the second direction DR2 in case coupled to the mask frame MF.

The fourth tension part TP4' may be disposed adjacent to a second long side of the cell mask CMK', may be spaced apart from the third tension part TP3' in the second direction DR2, and extend in the first direction DR1. The fourth tension part TP4' may be stretched from the cell mask CMK' in the reverse direction of the second direction DR2 in case coupled to the mask frame MF.

The cell mask film CPL may be stretched by the first to fourth tension parts TP1' to TP4' in a direction away from the cell mask CMK' on the plane defined by the first and second directions DR1 and DR2, and be disposed on the mask frame MF and be bonded. After the bonding part BP' of the cell mask CMK' included in the cell mask film CPL may be bonded on to the mask frame MF, the first to fourth tension parts TP1' to TP4' may be removed from the cell mask film CPL.

Each of the masking parts MP' may include a deposition part EVP' and a non-deposition part NEVP'. The non-deposition part NEVP' may include a pattern portion PP' and in an embodiment, the pattern portion PP' may include first to fourth pattern portions PP1' to PP4'. At least one pattern portion among the first and second pattern portions PP1' and PP2' may include sub pattern portions spaced apart from each other in the first direction DR1. In an embodiment, the first pattern portion PP1' may include a first sub pattern portion PP1_1' and a second sub pattern portion PP1_2' which may be spaced apart from each other in the first direction DR1 and extend in the second direction DR2. The second pattern portion PP2' may include a third sub pattern portion PP2_1' and a fourth sub pattern portion PP2_2' which may be spaced apart from each other in the first direction DR1 and extend in the second direction DR2.

At least one pattern portion among the third and fourth pattern portions PP3' and PP4' may include sub pattern portions spaced apart from each other in the second direction DR2. In an embodiment, although not shown, the third pattern portion PP3' may include sub pattern portions which may be spaced apart from each other in the second direction DR2 and extend in the first direction DR1. The fourth pattern portion PP4' may include sub pattern portions which may be spaced apart from each other in the second direction DR2 and extend in the first direction DR1.

FIG. 4B illustrates six masking parts MP' in a single cell mask CMK', but this is an example. The number of masking parts MP' included in the single cell mask CMK' may be more than or less than six. In addition, the shape of each of the cell masks CMK' may be changed according to the shape of the cell openings COP (see FIG. 3).

Figure 5B:
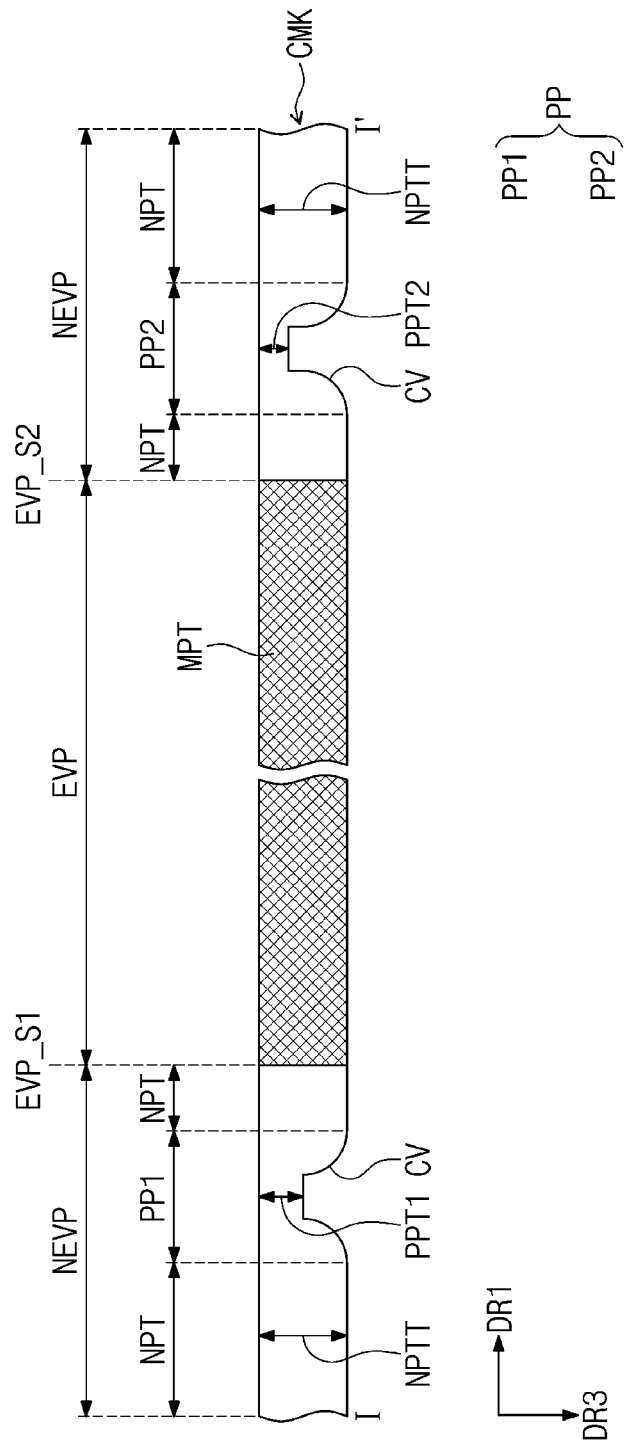
Figure 6A:
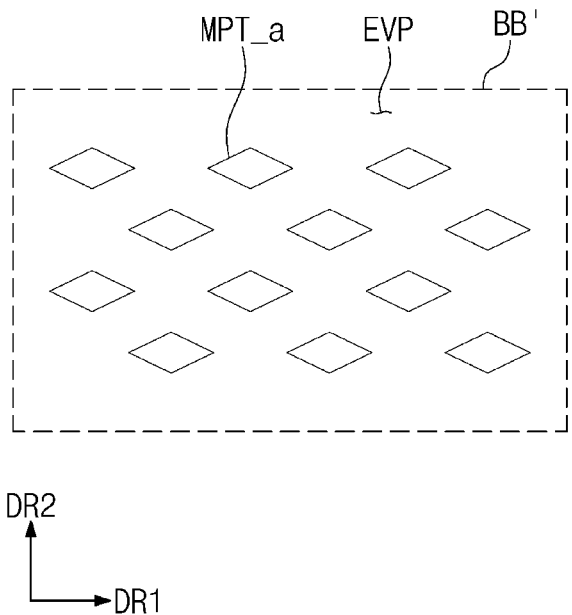
FIGS. 6A and 6B are exploded schematic plan views of a portion of a cell mask corresponding to portion BB' shown in FIG. 3.
Figure 6B:
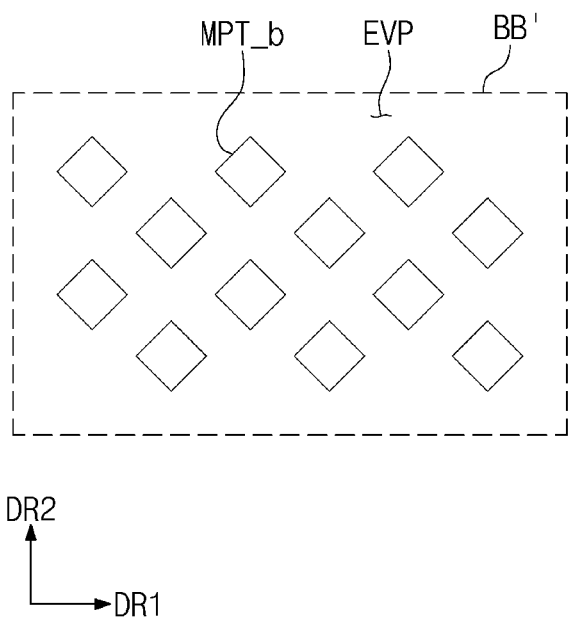

FIGS. 5A and 5B are schematic cross-sectional views of a cell mask taken along cut line I-I' shown in FIG. 4A. FIGS. 6A and 6B are exploded schematic plan views of a portion of a cell mask corresponding to portion BB' shown in FIG. 3. Hereinafter, descriptions of the same configuration as those described with reference to FIGS. 3 to 4 will be omitted.

Referring to FIG. 5A, the non-deposition part NEVP may include the non-pattern portion NPT and the pattern portion PP having a smaller thickness than the non-pattern portion NPT. In an embodiment, the pattern portion PP may include the first pattern portion PP1 disposed along the first side EVP_S1 of the deposition part EVP and the second pattern portion PP2 disposed along the second side EVP_S2. The first pattern portion PP1 and the second pattern portion PP2 may be spaced apart in the first direction DR1. In an embodiment, the first and second pattern portions PP1 and PP2 are illustrated as rectangular shapes, but this is merely an example. The shapes of the first and second portions PP1 and PP2 may be formed in various shapes such as round shapes. The shapes of the first and second pattern portions PP1 and PP2 may be variously determined according to the strength of the tensile force received by the cell mask CMK and the position to which the stress due to the tensile force may be concentrated.

In an embodiment, each of the first and second pattern portions PP1 and PP2 may include sub pattern portions spaced apart from each other in the first direction DR1. The first pattern portion PP1 may include first and second sub pattern portions PP1_1 and PP1_2 which may be spaced apart from each other in the first direction DR1. The second pattern portion PP2 may include third and fourth sub pattern portions PP2_1 and PP2_2 which may be spaced apart from each other in the first direction DR1. In an embodiment, the first and second pattern portions PP1 and PP2 may each include two or more sub pattern portions.

In an embodiment, with respect to the third direction DR3, the thickness PPT1 of the first pattern portion PP1 and the thickness PPT2 of the second pattern portion PP2 may be smaller than the thickness NPTT of the non-pattern portion NPT. In an embodiment, the thickness PPT1 of the first pattern portion PP1 and the thickness PPT2 of the second pattern portion PP2 may be different from each other. The thicknesses PPT1 and PPT2 of the first and second pattern portions PP1 and PP2 may be variously determined according to the strength of the tensile force received by the cell mask CMK and the position to which the stress due to the tensile force may be concentrated, or the like. In an embodiment, the smaller the thicknesses PPT1 and PPT2 of the first pattern and second pattern portions PP1 and PP2, the greater the stress due to the tensile force concentrated to the first and second pattern portions PP1 and PP2. In an embodiment, the thickness NPTT of the non-pattern portion NPT may be formed to be several to several ten micrometers, and the thicknesses PPT1 and PPT2 of the first and second pattern portions PP1 and PP2 may be formed to have about 5-95% of the thickness NPTT of the non-pattern portion NPT.

Since the thicknesses PPT1 and PPT2 of the first and second pattern portions PP1 and PP2 may be each smaller than the thickness NPTT of the non-pattern portion NPT, the stress due to tensile force may be concentrated to the first and second pattern portions PP1 and PP2 in case that the cell mask CMK receives the tensile force in the first direction DR1 and in the reverse direction of the first direction DR1. Accordingly, the deformation of the masking pattern MPT included in the deposition part EVP may be prevented, and in case that a light-emitting pattern of a display device is deposited using a mask assembly MKA (see FIG. 1), deterioration in the reliability and quality of the mask assembly MKA may be prevented and the display quality of the display device may be ensured.

Referring to FIG. 5B, the first and second pattern portions PP1 and PP2 may each include a curved surface portion CV. The thickness PPT1 of the first pattern portion PP1 and the thickness PPT2 of the second pattern portion PP2 may be different from each other. In case that the thickness PPT2 of the second pattern portion PP2 is smaller than the thickness PPT1 of the first pattern portion PP1, the stress due to the tensile force applied to the cell mask CMK may be further concentrated to the second pattern portion PP2 than to the first pattern portion PP1.

FIG. 6A illustrates a masking pattern in case that a pattern portion is not included in a non-deposition portion, and FIG. 6B illustrates a masking pattern in case that the non-deposition pattern includes a pattern portion PP.

Comparing FIGS. 6A and 6B, the shape of the masking pattern MPT_a may be deformed by the tensile force applied to a cell mask CMK in case that the pattern portion PP (see FIG. 5A) may not be included. Conversely, in case that the pattern portion PP may be included, the stress due to the tensile force may be concentrated on the pattern portion PP even in case that the tensile force is applied to the cell mask CMK, and the shape of the masking pattern MPT_b may not be deformed.

Figure 7:
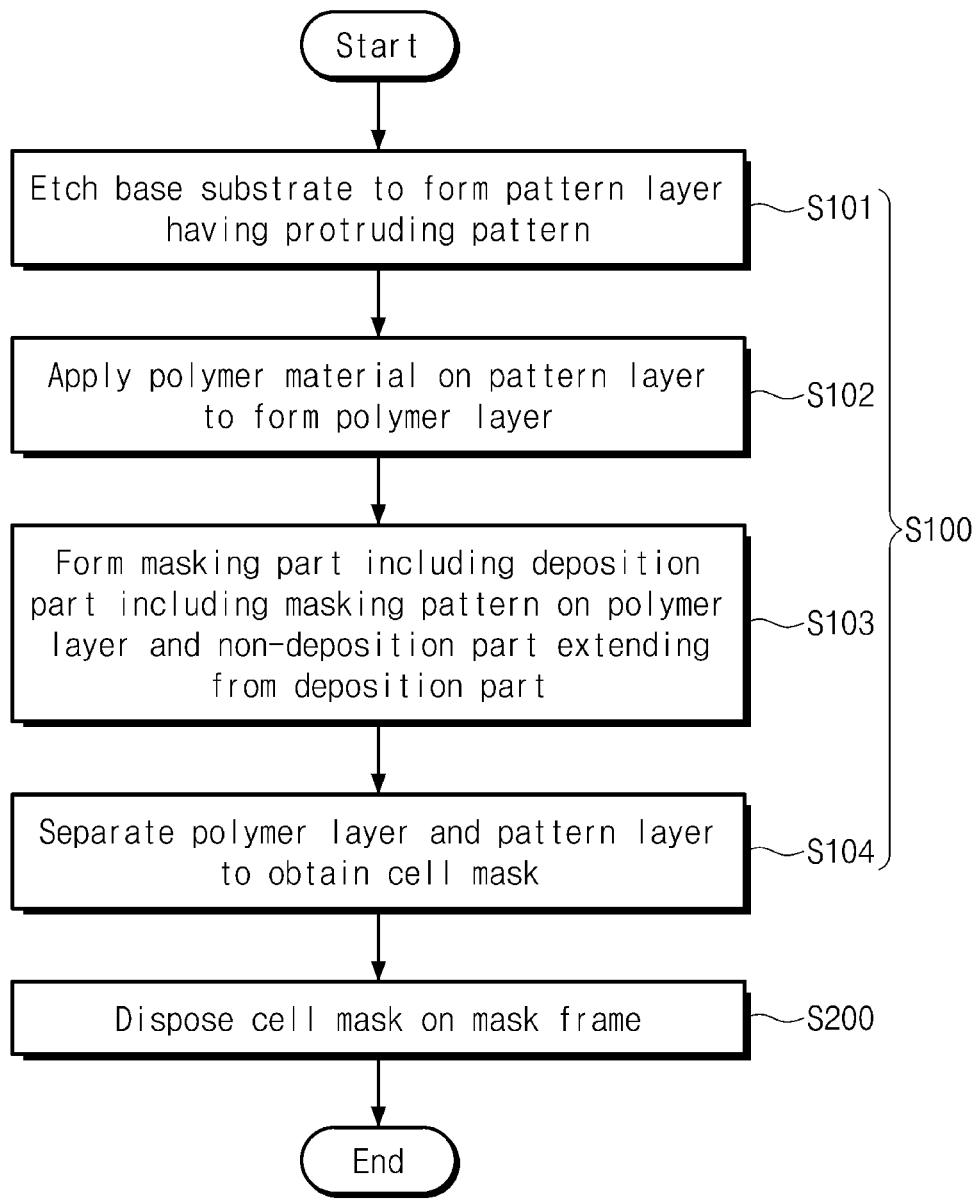
FIG. 7 is a flowchart schematically illustrating a mask assembly manufacturing method according to an embodiment.

FIG. 7 is a flowchart schematically illustrating a method for manufacturing a mask assembly according to an embodiment, and FIGS. 8A to 8E are schematic process diagrams illustrating a method for manufacturing a mask assembly according to an embodiment.

Referring to FIG. 7, a method for manufacturing the mask assembly may include manufacturing the cell mask including the masking part (S100) and disposing the cell mask on the mask frame (S200). FIGS. 8A to 8E illustrate a manufacturing process for the cell mask CMK' including the masking parts MP' and the bonding part BP' illustrated in FIG. 4B.

Figure 8A:
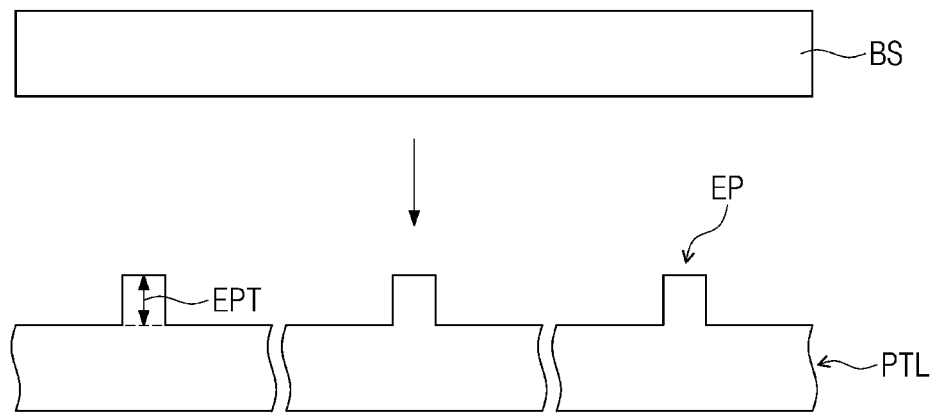
FIGS. 8A to 8E are schematic process diagrams illustrating a mask assembly manufacturing method according to an embodiment.
Figure 8B:
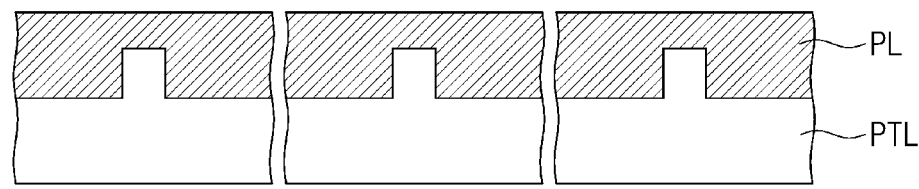
Figure 8C:
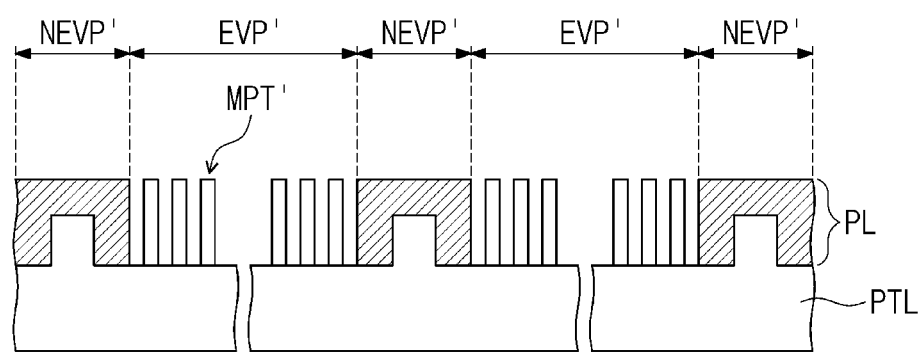
Figure 8D:
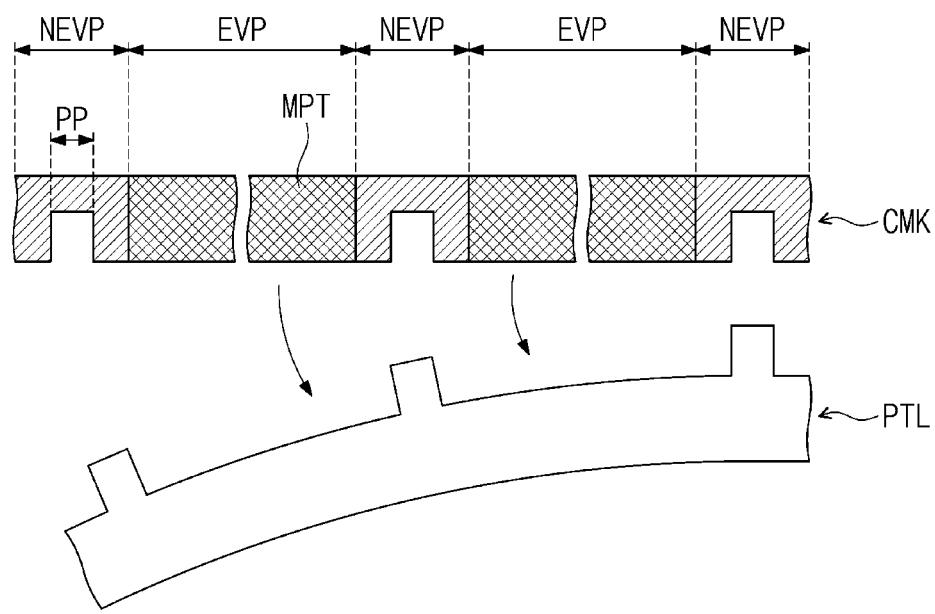

Referring to FIGS. 7 to 8D, the manufacturing of the cell mask CMK' (S100) may include etching a base substrate BS to form a pattern layer PTL having a protruding pattern EP (S101) and applying a polymer material on the pattern layer PTL to form a polymer layer PL (S102). The shape, height EPT, disposition, etc. of the protruding pattern EP may be determined on the basis of pre-analyzed result values in consideration of the positions of the masking parts MP' included in the cell mask CMK', the cell mask CMK', and the like in the disposing the cell mask CMK' on the mask frame MF (S200). In an embodiment, the height EPT of the protruding pattern EP may be formed to be several to several ten micrometers.

The manufacturing of the cell mask CMK' (S100) may include forming the masking part MP' which may include the deposition part EVP' including the masking pattern MPT' on the polymer layer PL, and the non-deposition part NEPT' extending from the deposition part EVP (S103) and separating the polymer PL and the pattern layer PTL to obtain the cell mask CMK' (S104). The non-deposition part NEVP' may include the pattern portion PP', which may correspond to the protruding pattern EP on the pattern layer PTL and have a smaller thickness than the non-pattern portion NPT'.

Figure 8E:
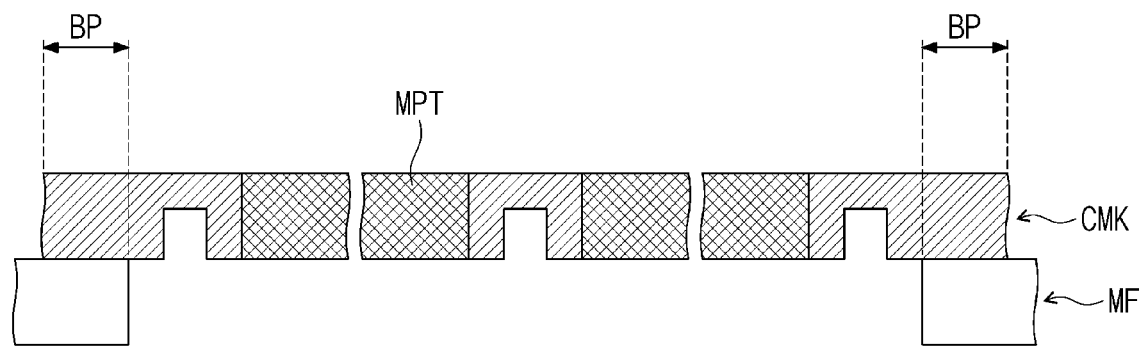

Referring to FIGS. 7 and 8E, in the disposing of the cell mask CMK' on the mask frame MF (S200), the bonding part BP' included in the cell mask CMK' may be disposed on the mask frame MF. In addition, in the disposing of the cell mask CMK' on the mask frame MF (S200), the cell mask CMK' may be disposed on the mask frame MF in a state in which tensile force may be applied to the cell mask.

Figure 9A:
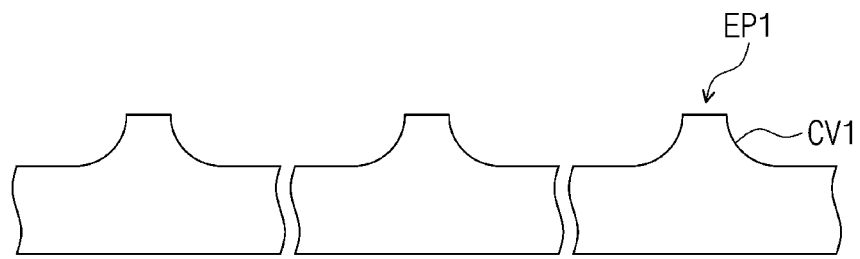
FIGS. 9A to 9C are schematic cross-sectional views of a pattern layer according to an embodiment.
Figure 9B:
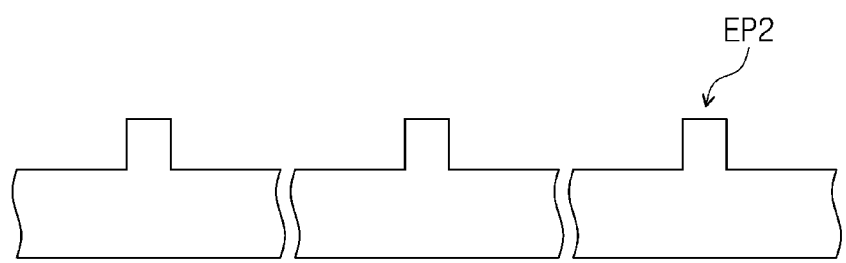
Figure 9C:
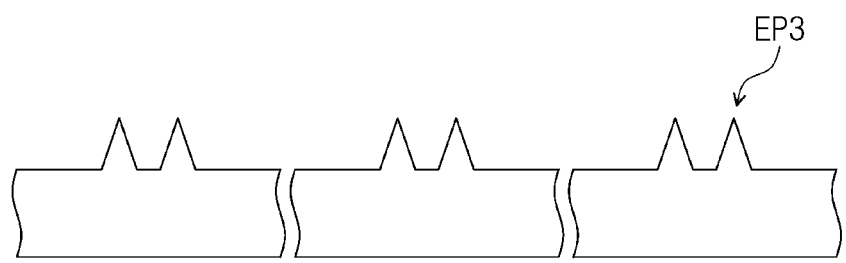

FIGS. 9A to 9C are schematic cross-sectional views of a pattern layer according to an embodiment.

Referring to FIGS. 7 and 9A to 9C, the protruding pattern EP (see FIG. 8A) formed by etching the base substrate BS (see FIG. 8A) may include various shapes according a calculation value analyzed in advance. In addition, the shape of the protruding pattern EP may also be determined according to a method for etching the base substrate BS. In an embodiment, in case that the base substrate BS is subjected to wet etching, a first protruding pattern EP1 may include a curved surface portion CV1 as illustrated in FIG. 9A.

Conversely, in case that the base substrate BS is etched by a dry etching or by using laser, second and third protruding patterns EP2 and EP3 may include a rectangular shape, a triangular shape, or the like as illustrated in FIGS. 9B and 9C. In an embodiment, the base substrate BS may include glass, plastic, ceramic, metal or the like, or a combination thereof.

Figure 10:
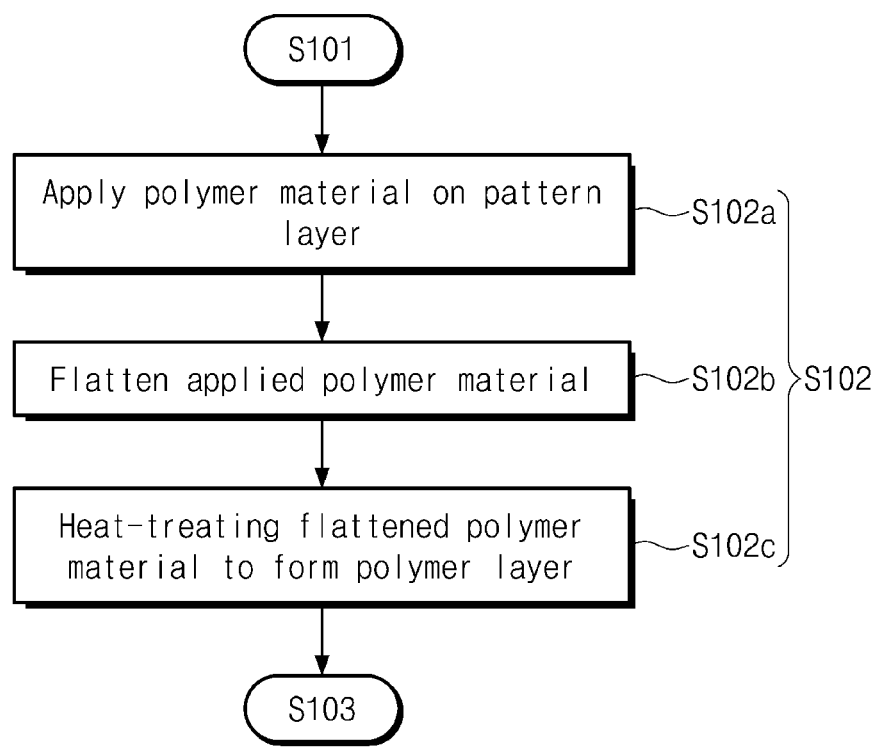
FIG. 10 is a flowchart schematically illustrating a step for forming a polymer layer according to an embodiment.

FIG. 10 is a flowchart schematically illustrating the forming of a polymer layer according to an embodiment.

Referring to FIGS. 7, 8B and 10, the forming of the polymer layer PL (S102) may include applying the polymer material on the pattern layer PTL (S102a), flattening the applied polymer material (S102b) and heat treating the flattened polymer material to form the polymer layer PL (S102c).

In an embodiment, in the flattening of the polymer material (S102b), in order to flatten the polymer material, the applying of the polymer material through slit coating may be repeated several times.

Figure 11:
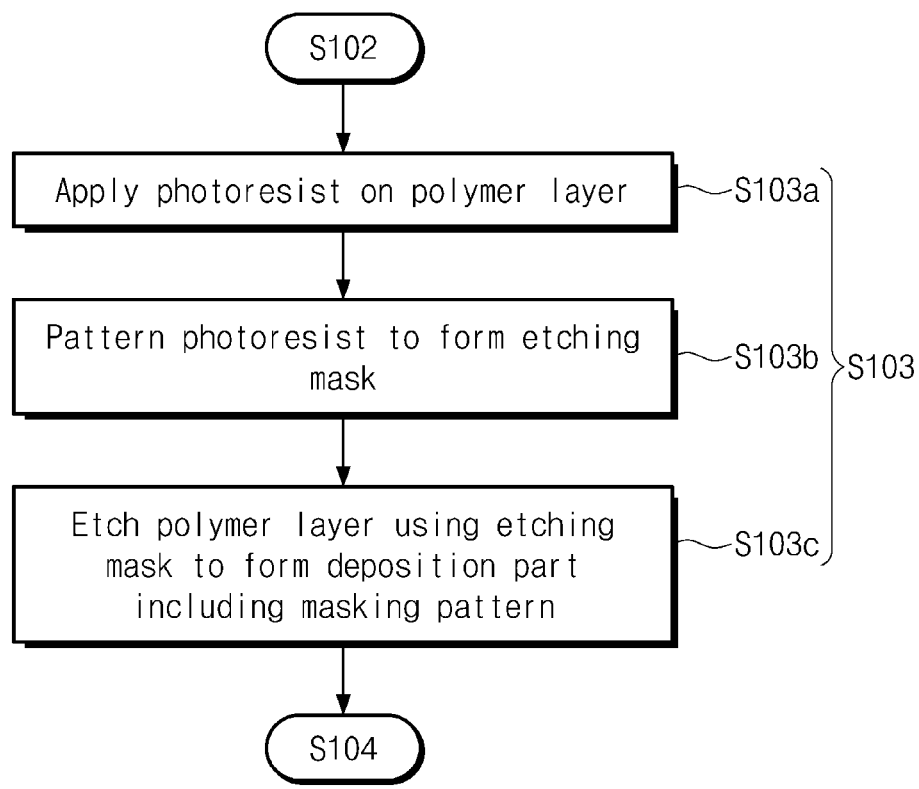
FIG. 11 is a flowchart schematically illustrating a step for forming a masking part according to an embodiment.

FIG. 11 is a flowchart schematically illustrating the forming of a masking part according to an embodiment.

Referring to FIGS. 7, 8C, and 11, the forming of the deposition part EVP' including the masking pattern MPT' (S103) may include applying a photoresist on the polymer layer PL (S103a), patterning the photoresist to form an etching mask (S103b), and etching the polymer layer PL using the etching mask to form the deposition part EVP' including the masking pattern MPT' (S103c).

In an embodiment, after applying the photoresist on the polymer layer PL, the etching mask for etching the masking pattern MPT' may be formed by patterning the applied photoresist. The photoresist may be a chemical material the property of which varies by responding to light, and the property of the photoresist may be different in a portion that received light and in a portion that did not receive light. Accordingly, the etching mask may be formed after exposing the photoresist to light, and the deposition part EVP' including the masking pattern MPT' may be formed by etching the polymer layer PL using the etching mask.

In an embodiment, the method for manufacturing the mask assembly MKA' may further include disposing a mesh frame MSF (shown in FIG. 3) including a metallic material on the mask frame MF and disposing the cell mask CMK' on the mesh frame MSF. The disposing of the mesh frame MSF and the disposing of the cell mask CMK' on the mesh frame MSF may be included between the manufacturing of the cell mask CMK' (S100) and the disposing of the cell mask CMK' on the mask frame MF (S200).

Figure 12:
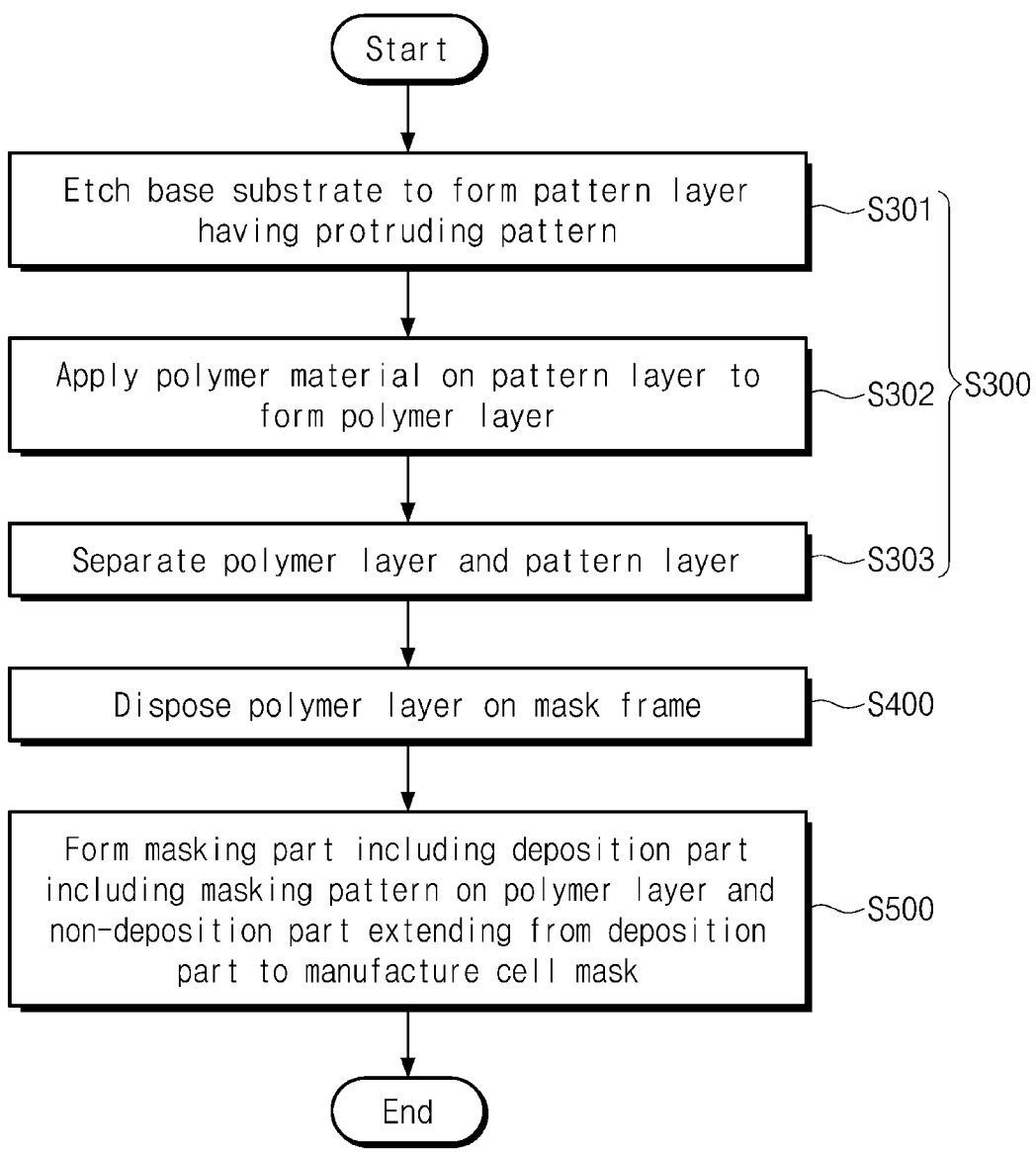
FIG. 12 is a flowchart schematically illustrating a mask assembly manufacturing method according to an embodiment.
Figure 13A:
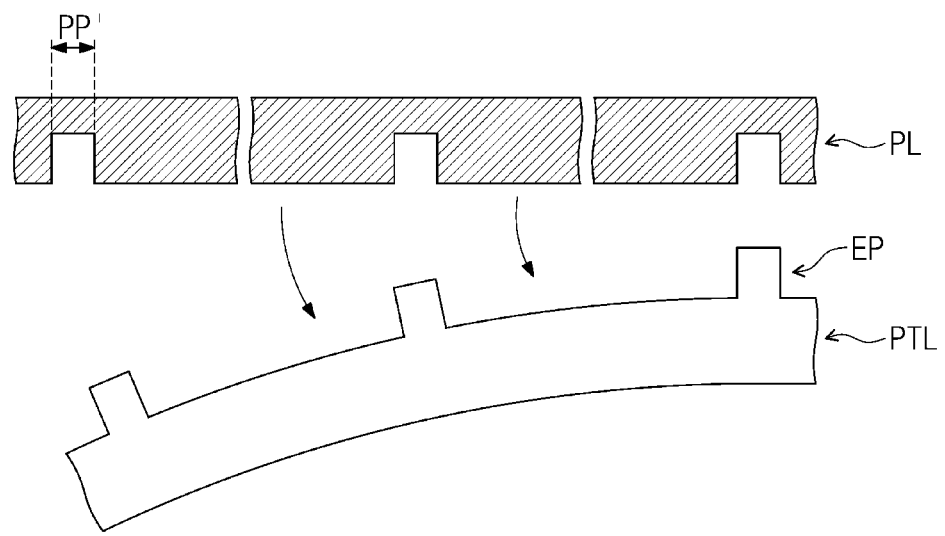
FIG. 13A is a schematic process diagram illustrating a step for separating a polymer layer and a base substrate according to an embodiment.
Figure 13B:
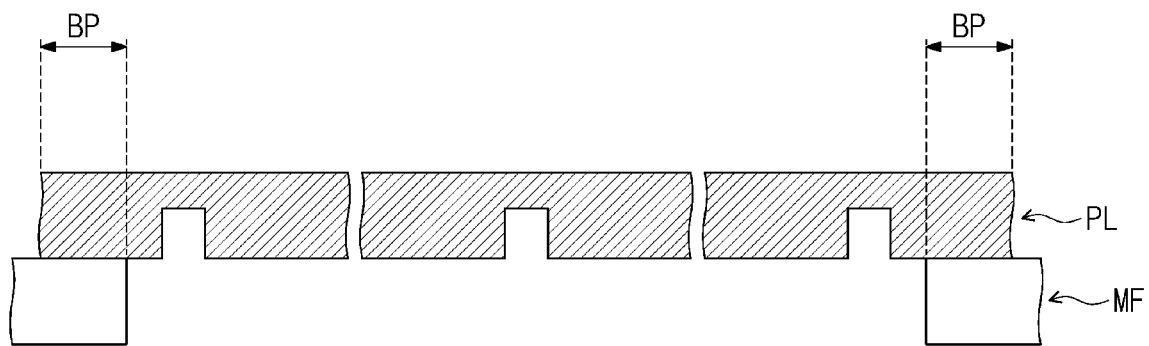
FIG. 13B is a schematic process diagram illustrating a step for disposing a polymer layer on a mask frame according to an embodiment.

FIG. 12 is a flowchart schematically illustrating a method for manufacturing a mask assembly according to an embodiment. FIG. 13A is a schematic process diagram illustrating a process for separating a polymer layer and a base substrate according to an embodiment. FIG. 13B is a schematic process diagram illustrating a process for disposing a polymer layer on a mask frame according to an embodiment. Hereinafter, descriptions of the same configuration as those described with reference to FIGS. 7 to 11 will be omitted.

Referring to FIGS. 12 to 13B, a method for manufacturing a mask assembly MKA' may include manufacturing a polymer layer PL including a polymer material (S300), disposing the polymer layer PL on the mask frame MF (S400) and forming a masking pattern MPT' on the polymer layer PL to manufacture a cell mask CMK' (S500). In an embodiment, in the manufacturing of the cell mask CMK' (S500), a masking part MP', which includes a deposition part EVP' including a masking pattern MPT' through dry etching or laser etching and a non-deposition part NEVP' extending from the deposition part EVP', may be formed.

Referring to FIGS. 12 and 13A, the manufacturing of the polymer layer PL (S300) may include etching the base substrate BS (see FIG. 8A) to form a pattern layer PTL having a protruding pattern EP (S301), applying the polymer material on the pattern layer PTL to form the polymer layer PL (S302), and separating the polymer layer PL and the pattern layer PTL (S303). In an embodiment, a pattern which corresponds to a pattern portion PP' of the cell mask CMK' to be manufactured later may be formed in the polymer layer PL, corresponding to the protruding pattern EP.

Referring to FIGS. 12 and 13B, in the disposing of the polymer layer PL on the mask frame MF (S400), the polymer layer PL corresponding to the bonding part BP' of the cell mask CMK' (see FIG. 8E) to be manufactured later may be disposed on the mask frame MF. In an embodiment, the polymer layer PL may be disposed on the mask frame MF in a state in which a tensile force may be applied to the polymer layer PL.

In an embodiment, the method for manufacturing a mask assembly MKA' may further include disposing a mesh frame MSF (see FIG. 3) including a metallic material on the mask frame MF and disposing the polymer layer PL on the mesh frame MSF. The disposing of the mesh frame MSF and the disposing of the polymer layer PL on the mesh frame MSF may be included between the manufacturing of the polymer layer (S300) and the disposing of the polymer layer on the mask frame (S400).

According to the disclosure, patterns may be formed in a deposition part including a masking pattern and in a non-deposition part between an outer frame included in a mask frame and a bonding part overlapping the outer frame. A pattern portion having smaller thicknesses than the non-pattern portion may be formed in at least one of the deposition part and the non-deposition part and thus, in case that a mask assembly is stretched, stress due to the stretching may be concentrated to the pattern portion. Accordingly, deformation of the deposition part including a masking pattern due to stress caused by stretching may be prevented and a shadow effect may be reduced during deposition through the mask assembly.

So far, the disclosure has been described with reference to embodiments. However, it will be understood by those skilled in the art that various modifications and variations can be made in the disclosure without departing from the spirit and technical area of the disclosure.

Therefore, the technical scope of the disclosure shall not be limited to the embodiments described in the detailed description, but rather should also include embodiments featuring such modifications and variations.

What is claimed is:

1. A mask assembly comprising:
   a mask frame comprising:
      a cell opening; and
      an outer frame defined along a periphery of the cell opening;
   a cell mask disposed on the mask frame and comprising a polymer material; and
   a mesh frame disposed between the mask frame and the cell mask, and including a metallic material, wherein
   the cell mask comprises:
      a masking part comprising:
         a deposition part disposed corresponding to the cell opening of the mask frame and comprising a masking pattern; and
         a non-deposition part extending from the deposition part; and
         a bonding part overlapping the outer frame of the mask frame and extending from the masking part,
      the non-deposition part comprises:
         a non-pattern portion; and a pattern portion having a thickness smaller than a thickness of the non-pattern portion, wherein the masking part is parallel to a plane defined by a first direction and a second direction intersecting the first direction, and the pattern portion comprises:

at least one first pattern portion disposed along a side among sides facing each other in the first direction of the deposition part; and at least one third pattern portion disposed along a side among sides facing each other in the second direction of the deposition part, wherein a number of the at least one first pattern portion is different from a number of the at least one third pattern portion.

2. The mask assembly of claim 1, wherein the pattern portion further comprises:

at least one second pattern portion disposed along another side among the sides facing each other in the first direction of the deposition part.

3. The mask assembly of claim 2, wherein a thickness of the at least one first pattern portion and a thickness of the at least one second pattern portion are different from each other.

4. The mask assembly of claim 2, wherein at least one of the at least one first pattern portion and the at least one second pattern portion comprises sub pattern portions spaced apart from each other in the first direction.

5. The mask assembly of claim 2, wherein the pattern portion further comprises:

at least one fourth pattern portion disposed along another side among the sides facing each other in the second direction of the deposition part.

6. The mask assembly of claim 5, wherein a thickness of at least one pattern portion among the at least one first pattern portion, the at least one second pattern portion, the at least one third pattern portion, and the at least one fourth pattern portion is different from thicknesses of other pattern portions among the at least one first pattern portion, the at least one second pattern portion, the at least one third pattern portion, and the at least one fourth pattern portion.

7. The mask assembly of claim 5, wherein at least one of the at least one third pattern portion and the at least one fourth pattern portion comprises sub pattern portions spaced apart from each other in the second direction.

8. The mask assembly of claim 1, wherein the pattern portion comprises curved surface portions.

9. The mask assembly of claim 1, wherein the cell mask comprises polyimide.

10. The mask assembly of claim 1, wherein the thickness of the pattern portion is determined according to a strength of a tensile force to be applied to the cell mask.

* * * * *